(12) United States Patent
Nakada

(10) Patent No.: US 6,552,995 B1
(45) Date of Patent: Apr. 22, 2003

(54) SPECTRUM DIFFUSION SIGNAL ANALYZER AND METHOD OF ANALYZING DIFFUSION SIGNAL

(75) Inventor: Juichi Nakada, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/252,218

(22) Filed: Feb. 18, 1999

(30) Foreign Application Priority Data

Feb. 19, 1998 (JP) .......................................... 10-037105

(51) Int. Cl.[7] ............................................... H04J 11/00
(52) U.S. Cl. ......................... 370/206; 370/208; 370/210
(58) Field of Search .............................. 370/210, 335, 370/208, 206, 342

(56) References Cited

U.S. PATENT DOCUMENTS

| | | | | |
|---|---|---|---|---|
| 4,574,311 A | * | 3/1986 | Resnikoff et al. | 348/315 |
| 4,755,795 A | * | 7/1988 | Page | 341/122 |
| 5,812,523 A | * | 9/1998 | Isaksson et al. | 370/210 |
| 5,943,170 A | * | 8/1999 | Inbar et al. | 359/561 |
| 6,094,428 A | * | 7/2000 | Bruckert et al. | 370/335 |
| 6,381,263 B1 | * | 4/2002 | Suzuki | 370/210 |

FOREIGN PATENT DOCUMENTS

| | | |
|---|---|---|
| DE | 4032568 | 4/1992 |
| DE | 4411098 | 10/1995 |

OTHER PUBLICATIONS

English Language Abstract of DE 40 32 568.
English Language Abstract of DE 44 11 098.
"Receiver Design for a Combined RF Network and Spectrum Analyzer", by Y. Yanagimoto, Hewlett–Packard Journal, Oct. 1993, pp. 85–94.

* cited by examiner

Primary Examiner—Chau Nguyen
Assistant Examiner—Keith M. George
(74) Attorney, Agent, or Firm—Greenblum & Bernstein, P.L.C.

(57) ABSTRACT

According to the present invention, the inputted spectrum diffusion signal is orthogonal-transformed (16), and then, the common mode output Zre and the orthogonal mode output Zim are respectively AD-transformed (23, 24). Zre and Zim are respectively inputted to series connections of delay units respectively having a sampling period, and the corresponding delayed outputs are complex-multiplied (20i). Each output is N-points-complex-Fast-Fourier-transformed, and the absolute value of the each coefficient is squared. The squared absolute value is two-dimensionally displayed by setting a horizontal axis as a frequency axis and a longitudinal axis as a time axis (32). Then, a carrier wave frequency error is obtained from the maximum peak of the frequency, and a timing phase is obtained from the time.

18 Claims, 7 Drawing Sheets

15 DISTRIBUTOR
30 DELAY-COMPLEX MULTIPLIER
31 N POINTS COMPLEX-FFT COMPUTING UNIT
32 DISPLAY UNIT
33 ABSOLUTE VALUE SQUARE COMPUTING UNIT

15 DISTRIBUTOR
30 DELAY-COMPLEX MULTIPLIER
31 N POINTS COMPLEX-FFT COMPUTING UNIT
32 DISPLAY UNIT
33 ABSOLUTE VALUE SQUARE COMPUTING UNIT

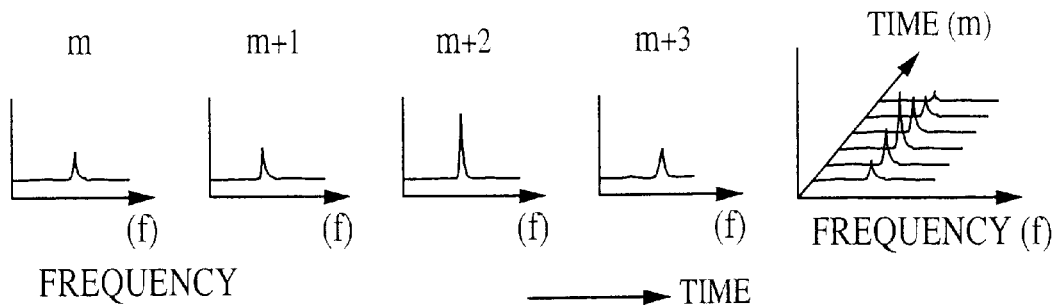
FIG. 3A
FIG. 3B
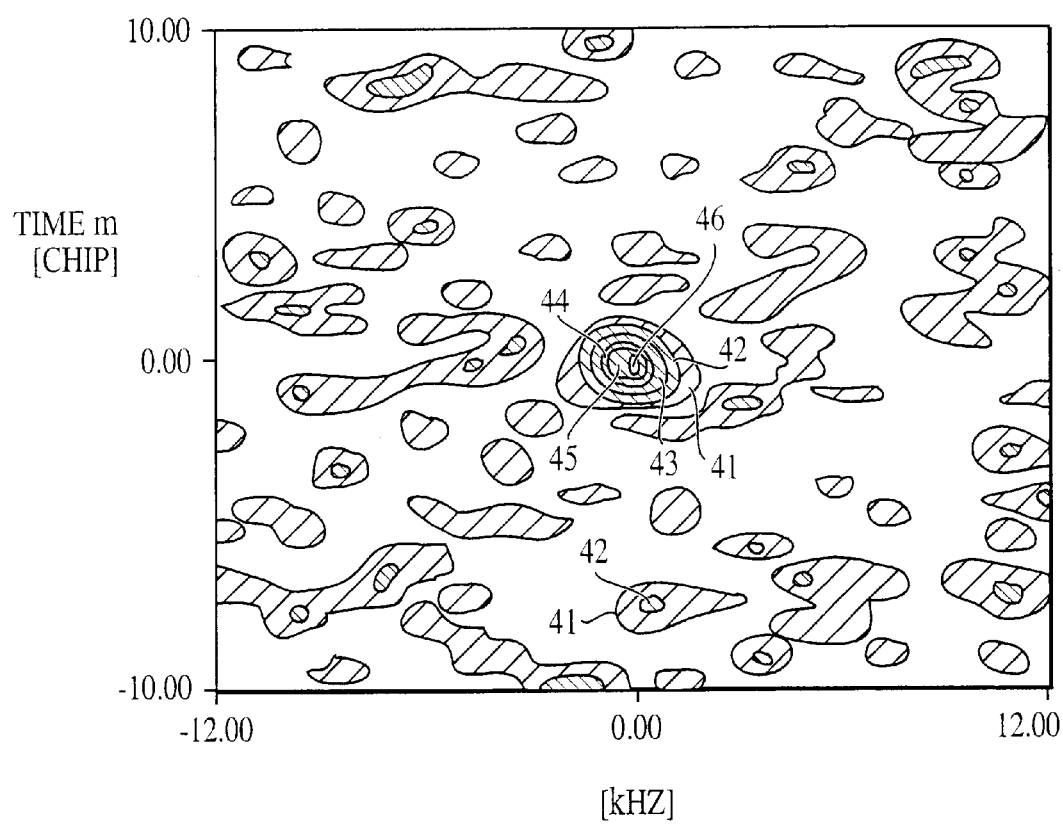
FIG. 3C

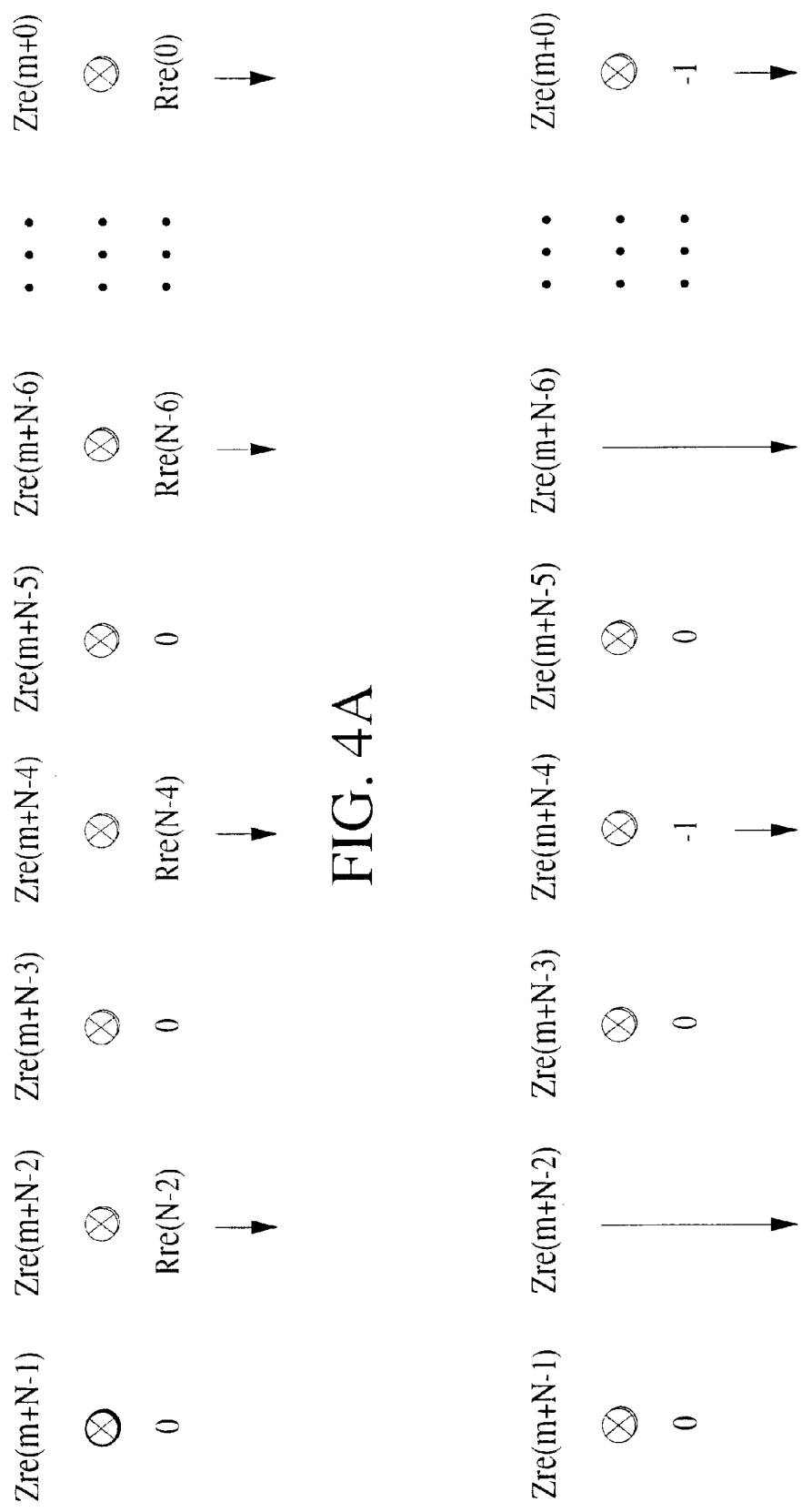

23 A/D TRANSFORMATION

23 A/D TRANSFORMATION
16 ORTHOGONAL TRANSFORMATION

16    ORTHOGONAL TRANSFORMATION
23,24 A/D TRANSFORMATION

SPECTRUM DIFFUSION SIGNAL ANALYZER AND METHOD OF ANALYZING DIFFUSION SIGNAL

BACKGROUND OF THE INVENTION

1. Field of the Invention

The present invention relates to a spectrum diffusion signal analyzer, which is used for measuring an error of a carrier wave frequency with respect to a reference frequency or a signal period timing in the field of a spectrum diffusion communication, and for demodulating the spectrum diffusion signal.

2. Description of the Related Art

With respect to the wireless communication of the CDMA (Code Division Multiple Access), if a spectrum diffusion signal is received, it is necessary to synchronize the diffusion code such as PN code, Walsh code, or Gold code, of the received signal with a diffusion code signal of a local station. In order to make the synchronization, there is a method of searching a correlation between the inputted signal and the diffusion code signal, and of searching the point wherein the correlation value has the maximum value with respect to a time axis.

On the other hand, with respect to the wireless communication, there is an error in the received carrier wave frequency with respect to a reference carrier wave frequency. The error is caused by the Doppler shift or a frequency error of a reference frequency source provided in a transmitter. There is a possibility that a measuring device cannot detect an error in setting a center frequency, or cannot detect a reference frequency exactly.

If there is a carrier wave frequency error, it is difficult to make synchronization with respect to a time axis, since the peak of the correlation value does not appear. Therefore, there is a method including the steps of dividing a frequency range, and searching a synchronization point by sequentially changing a received carrier wave frequency. If a carrier wave frequency is shifted by $\Delta\omega$, a frequency of a complex signal $Z(i)$ obtained by an orthogonal transformation (i is the number of samples and represents a time) is corrected, and therefore, it is expressed by $Z(i) \times \exp(-j \Delta\omega i)$. Then, a squared absolute value of the product of the corrected signal and the complex-conjugate $R^*$ of the diffusion code signal R, i.e. a correlation, is calculated.

$$|\Sigma_{i=0}^{L}[Z(i) \times \exp(-j\Delta\omega i)] \times R^*(i)|^2 \quad (1)$$

The time shift of the squared absolute value of the correlation value, i.e. the peak of the correlation curve is the synchronous position. The correlation curve is given as follows:

$$C(m) = |\Sigma_{i=0}^{L}[Z(m+i) \times \exp(-j\Delta\omega \cdot (m+i))] \times R^*(i)|^2$$

The frequency-shifted correlation curve is represented as follows:

$$C_{-(N/2-1)}(m) = |\Sigma_{i=0}^{L}[Z(m+i) \times \exp(-j \cdot (-(N/2-1)) \cdot \Delta\omega \cdot (m+i))] \times R^*(i)|^2$$

$$C_{-1}(m) = |\Sigma_{i=0}^{L}[Z(m+i) \times \exp(-j \cdot -\Delta\omega \cdot (m+i))] \times R^*(i)|^2$$

$$C_0(m) = |\Sigma_{i=0}^{L}[Z(m+i) \times \exp(-j \cdot (m+i))] \times R^*(i)|^2$$

$$C_1(m) = |\Sigma_{i=0}^{L}[Z(m+i) \times \exp(-j \cdot \Delta\omega \cdot (m+i))] \times R^*(i)|^2$$

$$C_2(m) = |\Sigma_{i=0}^{L}[Z(m+i) \times \exp(-j \cdot 2\Delta\omega \cdot (m+i))] \times R^*(i)|^2$$

$$C_{N/2}(m) = |\Sigma_{i=0}^{L}[Z(m+i) \times \exp(-j \cdot (N/2)) \cdot \Delta\omega \cdot (m+i))] \times R^*(i)|^2$$

Here, N is one period of the diffusion codes (code length).

Because of the frequency error, the frequency having the maximum peak of the correlation curve peak is searched by detecting the correlation curves by shifting the frequency range $\Delta\omega$ by $\Delta\omega$.

The above is explained in detail, for example, in the "Spectrum Diffusion Communication System", pages 333–337, written by Yokoyama, published by Science Technology Publishers.

However, a time synchronization is performed by sequentially changing a frequency range, and by shifting the diffusion code a half chip by a half chip within the frequency range. Then, if a peak value greater than a threshold value cannot be obtained, the same steps are repeated with a shifting of the frequency range. Therefore, a hardware for sequentially changing the frequency is needed. Or alternatively, if it is performed by a software, a time for changing a frequency of a signal is necessary. Namely, there is a problem that the hardware scale becomes greater, or a problem that a processing time becomes longer.

SUMMARY OF THE INVENTION

Accordingly, an object of the present invention is to substantially eliminate defects and drawbacks encountered in the prior art and to provide a spectrum diffusion analyzer, which can detect a displacement of a carrier wave frequency of a received signal with respect to a reference carrier wave frequency, and a timing drift of a diffusion signal without changing a frequency.

According to the present invention, the above mentioned object can be achieved by a spectrum diffusion analyzer including: a device for orthogonal-transforming inputted spectrum diffusion signal; a device for calculating a product of the orthogonal-transformed signal and a complex-conjugate of a diffusion code signal; a device for discrete-Fourier-transforming data series of the calculated product; and a device for calculating a squared absolute value of each Fourier-transformed coefficient.

According to the present invention, an inputted spectrum diffusion signal is orthogonal-transformed, and a product of the orthogonal-transformed signal and a complex-conjugate of a diffusion code signal is calculated. Then, data series of the calculated product is discrete-Fourier-transformed, and a squared absolute value of each Fourier-transformed coefficient is calculated.

The spectrum diffusion analyzer may further include: a peak searching device for searching a displacement of said diffusion code signal with respect to a reference time when said each squared value has a maximum value within one period of the diffusion code signal, and for searching a frequency of the corresponding coefficient.

According to the present invention, a displacement of said diffusion code signal with respect to a reference time when said each squared value has a maximum value within one period of the diffusion code signal, and a frequency of the corresponding coefficient as a carrier wave frequency error are searched.

Namely, with respect to the above formula (1), the transformation of the product is performed within the bracketed area represented by the symbol $\Sigma$. The formula (1) is represented by the following formula (2), since m is constant within the absolute value symbols.

$$C(m) = \left| \sum_{i=0}^{L} [Z(m+i) \times R^*(i)] \times \exp(-j \cdot \Delta\omega \cdot i) \times \exp(-j \cdot \Delta\omega \cdot m) \right|^2 \qquad (2)$$

$$= \left| \sum_{i=0}^{L} \{[Z(m+i) \times R^*(i)] \times \exp(-j \cdot \Delta\omega \cdot i)\} \right|^2$$

Formula (2) is a formula for discrete-Fourier-transforming (Z(m+i)×R*). Therefore, according to the present invention, the product of the inputted orthogonal-transformed signal Z(m+i) and the complex-conjugate R* of the diffusion code series are calculated with respect to each sample, and then, the data series resulted from the calculation are discrete-Fourier-transformed. Finally, the squared absolute value of each coefficient obtained from the discrete-Fourier-transformation is a correlation value with respect to m. If the discrete-Fourier-transformation is performed with respect to each frequency, $C_f(m)$ is calculated. By using the FFT (Fast-Fourier-Transformation) with respect to the discrete-Fourier-transformation, $C_f(m)$ is calculated with respect to each discrete-frequency. If the same calculation is performed with respect to m, m+1, m+2, . . . , the two-dimensional correlation data with respect to the discrete-frequency (frequency error) and the discrete-time (timing displacement) are obtained.

According to the present invention with respect to the spectrum diffusion signal analyzer, the peak searching device is a display device, which includes one of orthogonal axes as a frequency axis and the other as a time axis, for displaying the squared value.

Furthermore, according to the present invention, the display means three-dimensionally displays a level of the squared value by using another axis, which is perpendicular to the both of the orthogonal axes.

According to the present invention, the display means displays a level of the squared value by using a level of brightness, or the display means displays a level of the squared value by using colors, each of which respectively corresponds to each level of the squared value.

According to another aspect of the present invention, a method of analyzing spectrum diffusion signal includes an AD transformation step of transforming inputted spectrum diffusion signal to digital data series; an orthogonal-transformation step of orthogonal-transforming the digital data series, and temporally storing the orthogonal-transformed data series; a multiplication step of complex-multiplying each sample having the orthogonal-transformed data series and the complex conjugate of the diffusion code signal; a Fourier-transformation step of discrete-Fourier-transforming samples corresponding to a period of the diffusion code of the complex-multiplied sample; a square calculation step of calculating squared absolute values with respect to each frequency component of the discrete-Fourier-transformed samples; a step of repeating the multiplication step, the Fourier-transformation step, and the square calculation step with sequentially shifting a relative phase between the orthogonal-transformed data series and the diffusion code signal within a chip period until a sum of the shifted relative phases arrives at one period of the diffusion code; and a search step of searching a timing drift of the diffusion code with respect to that of inputted signal in accordance with a calculated result of said square calculation step, and of searching a carrier wave frequency error of the inputted signal.

According to the present invention with respect to this method, a sampling frequency used at the AD transformation step is J times as common as a chip frequency of the diffusion code signal, wherein J is an integer, and the said multiplication step is performed at every J samples.

Furthermore, according to the present invention, the diffusion code signal includes a series of binary data, and at the multiplication step, adding process is performed with or without transforming a code of the orthogonal-transformed data in accordance with a value of the binary data of the diffusion code signal.

According to the present invention, the search step includes the steps of displaying the squared value with using one of orthogonal axes as a frequency axis and the other as a time axis, searching a maximum peak of the squared value, and searching the corresponding frequency and time.

Furthermore, according to the present invention, a level of the squared value is displayed by using a level of brightness, or by using colors, each of which respectively corresponds to each level of the squared value.

The nature, utility, and further features of this invention will be more clearly apparent from the following detailed description with respect to preferred embodiments of the invention when read in conjunction with the accompanying drawings briefly described below.

BRIEF DESCRIPTION OF THE DRAWINGS

In the accompany drawings:

FIGS. 3A–3C are diagrams showing examples for displaying the results of the apparatus according to the present invention;

FIG. 4A is a diagram showing a part of an example with respect to complex-multiplication in a case where a sampling rate is twice as common as a chip rate;

FIG. 4B is a diagram showing a part of another example with respect to complex-multiplication in a case where a diffusion code is a binary data;

DESCRIPTION OF THE PREFERRED EMBODIMENTS

A preferred embodiment according to the present invention will now be described below with reference to the accompanying drawings. It should be noted that the same reference numbers are used to denote the same elements.

Figure 1:
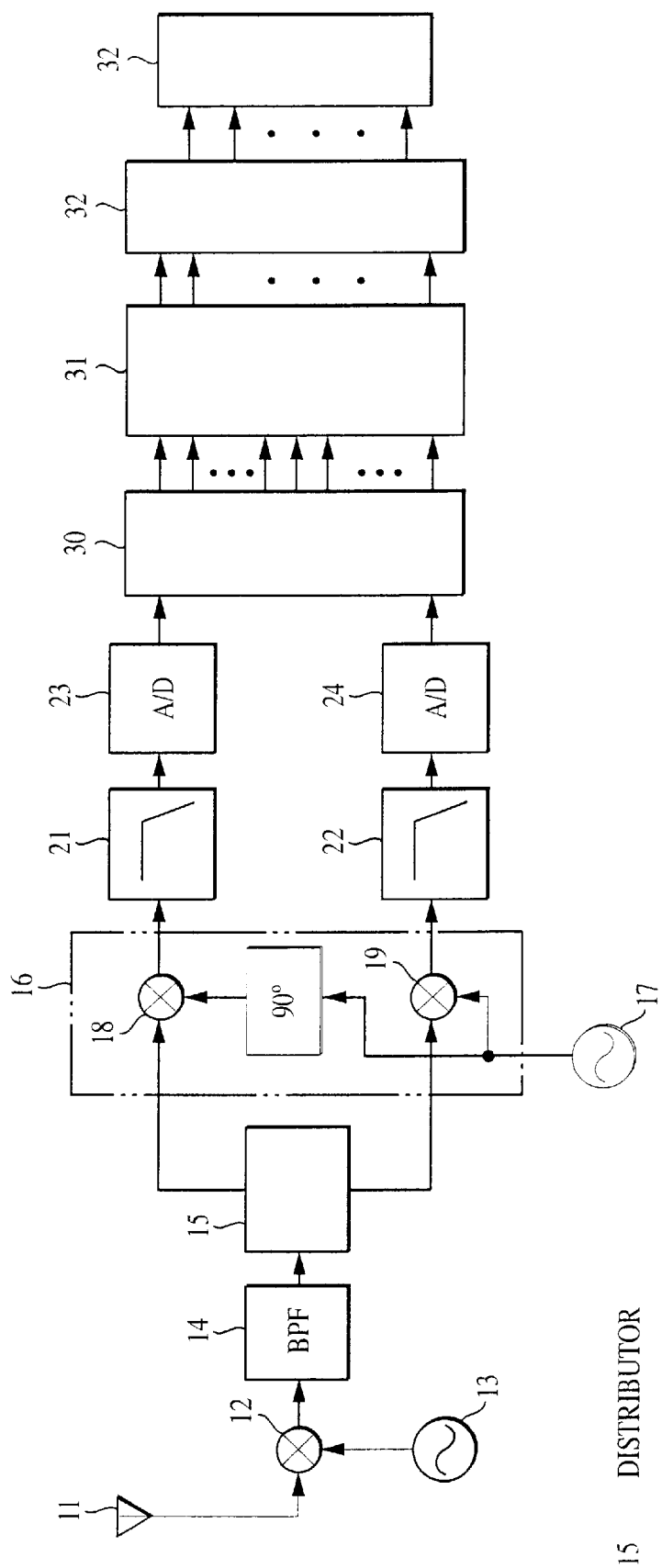
FIG. 1 is a functional block diagram showing a first embodiment of the present invention.

FIG. 1 is a block diagram showing an embodiment according to the present invention. A spectrum diffusion signal received by an antenna 11 is frequency-converted by using a frequency mixer 12 and a local oscillator 13, and the intermediate frequency component of the spectrum diffusion signal is extracted by a band pass filter 14. The intermediate frequency signal is divided into two signals by a distributor 15, and then the two signals are orthogonal-transformed at an orthogonal transformer 16 by using a signal supplied from a local oscillator 17. Namely, one of the two signals is frequency-mixed at a frequency-mixer 18 with a 90° phase-shifted signal with respect to an output signal of the local oscillator 17. The other of the two signals is frequency-mixed at a frequency mixer 19 with the output signal of the local oscillator 17. Each output of the frequency mixers 18, 19 is respectively low-pass-filtered by low-pass filters 21, 22, then respectively analog-to-digital-converted by AD-converters 23, 24, and finally supplied to a delay-complex multiplier 30.

Figure 2:
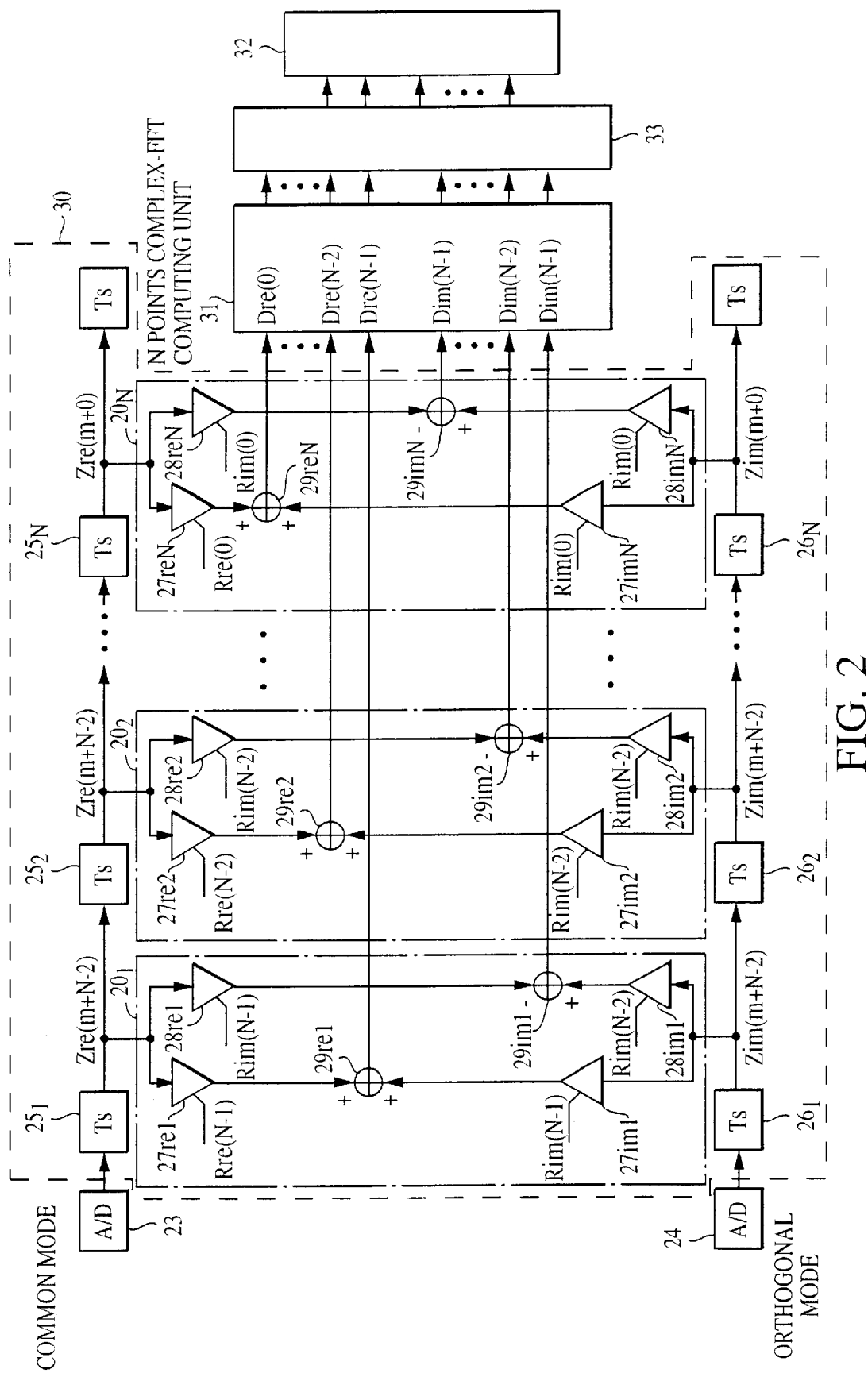
FIG. 2 is a diagram showing a concrete example of a delay-complex multiplier 30 shown in FIG. 1.

As shown in FIG. 2, with respect to the construction of the delay-complex multiplier 30, a common-mode digital series (the output of the AD converter 23) is inputted to a series connection of N delay units $25_1$–$25_N$ respectively having a sampling period Ts. An orthogonal-mode digital series is inputted to a series connection of N delay units $26_1$–$26_N$ respectively having a delay time of a sampling period Ts. Similarly, an orthogonal-mode digital series (the output of the AD converter 24) is inputted to a series connection of N delay units $26_1$–$26_N$ respectively having a delay time Ts.

The output Zre(m+N–i) of the delay unit 25i (i=1–N), and the output Zim(m+N–i) of the delay unit 26i, which corresponds to the delay unit 25i, are respectively complex-multiplied by a complex-multiplier 20i. The complex-multiplier 20i computes at multiplier 27rei the product of the output Zre(m+N–i) of the delay unit 25i and the real part Rre(N–i) of diffusion code series R*(N–i), and at multiplier 28rei the product of the output of the delay unit 25i and the imaginary part Rim(N–i) of the diffusion code series R*(N–i). Furthermore, the complex-multiplier 20i computes at multiplier 27imi the product of the output Zim(m+N–i) of the delay unit 26i and the imaginary part Rim(N–i) of R*(N–i), and at multiplier 28imi the product of the output Zim(m+N–i) of the delay unit 26i and the real part Rre(N–i) of R*(N–i). An adder 29rei respectively computes the sum of each output of the multiplier 27rei and that of the multiplier 27imi, and then, outputs the real part Dre(N–i) of the result of the complex-multiplication. An adder 29imi respectively computes each sum of the output of the multiplier 28rei and that of the multiplier 28imi, and then, outputs the imaginary part Dim(N–i) of the result of the complex-multiplication.

The real part outputs Dre(0)–Dre(N–1) and the imaginary part outputs Dim(0) –Dim(N–1) of N points complex-multipliers $20_1$–$20_N$ are inputted to an N-points-complex-FFT computing unit 31, and then, the Fast-Fourier-Transformation (FFT transformation) is performed. The outputs of the N-points-complex-FFT computing unit 31 are supplied to a display unit 32, after the absolute value of each coefficient of the outputs is respectively squared by an absolute value square computing unit 33.

For example, the results of the FFT transformation at the time of m with respect to N points datum of a data-series, which results from the multi-multiplication results at the corresponding time between the sample series of inputted complex-signal Zi and the complex-conjugate R* of the diffusion code signal, can be obtained as shown in FIG. 3A(m). The FFT transformation results at the time of m+1, can be obtained as shown in FIG. 3A(m+1), and then the subsequent results can be obtained accordingly. Namely, the FFT results, the time (phase) of which is subsequently shifted by one sampling period Ts, can be obtained accordingly.

The computed square result of each absolute value of the outputs is three-dimensionally displayed as shown in FIG. 3B, wherein the longitudinal axis represents a frequency f, the horizontal axis represents a level of the output, and the vertical axis, which is vertical with respect to the longitudinal and the horizontal axes, represents a time (m). Alternatively, the result may be displayed as shown in FIG. 3C, wherein the longitudinal axis represents a frequency, the horizontal axis represents a time (m), and a level of the output is represented by brightness or color.

With respect to FIG. 3B, the frequency f of the point (f, m) having the greatest peak level represents a carrier wave frequency error, and the time m represents a timing phase drift of a diffusion code. With respect to the presentation shown in FIG. 3C, it is possible to know the carrier wave frequency error and the timing phase drift by using the point (f, m) having the greatest peak level, or the color point, which corresponds to the greatest brightness with respect to brightness and color. With respect to FIG. 3C, the same hatched portion (having the same reference number) has the same color, and then, if the reference number is different, the displayed color is also different. In this example, the reference number 46 represents the point (f, m) having the greatest brightness. The brightness is greatly changed around the point (f, m), and therefore, it is possible to detect the point (f, m) immediately.

If a sampling frequency 1/Ts is J times as common as a chip frequency 1/Tc of a diffusion code signal, wherein the number J is an integer, then the data of the diffusion code signal is located at every $J^{th}$ samples, and the remaining samples are zero. Therefore, if the number J is equal to two, then the multiplication of the period component Zre(m+N–i) of the orthogonal transformation and the real part Rre(N–i) of the diffusion code signal is as shown in FIG. 4A. Therefore, the products of every second Rre(N–i), i.e. Rre(N–2), Rre(N–4), Rre(N–6), - - - Rre(0), and the corresponding inputted period components are computed.

Each chip of diffusion codes is binary data, which is generally represented by 1 and 0. In this case, ±1 is used as the signal of the diffusion code. Therefore, the value of Rre(N–i)is +1 or –1. If the number J is equal to 2, the output is supplied at every other sample. However, every second output, namely every fourth common mode component of the orthogonal transformation output, i.e. Zre(m+N–2), Zre(m+N–6), - - - , represents the result of the multiplication. The result of the multiplication can be obtained by code-changing every fourth common mode component with respect to every other output, i.e. –Zre(m+N–4), –Zre(m+N–8), - - - . The multiplications with respect to the other components are computed similarly.

Figure 5:
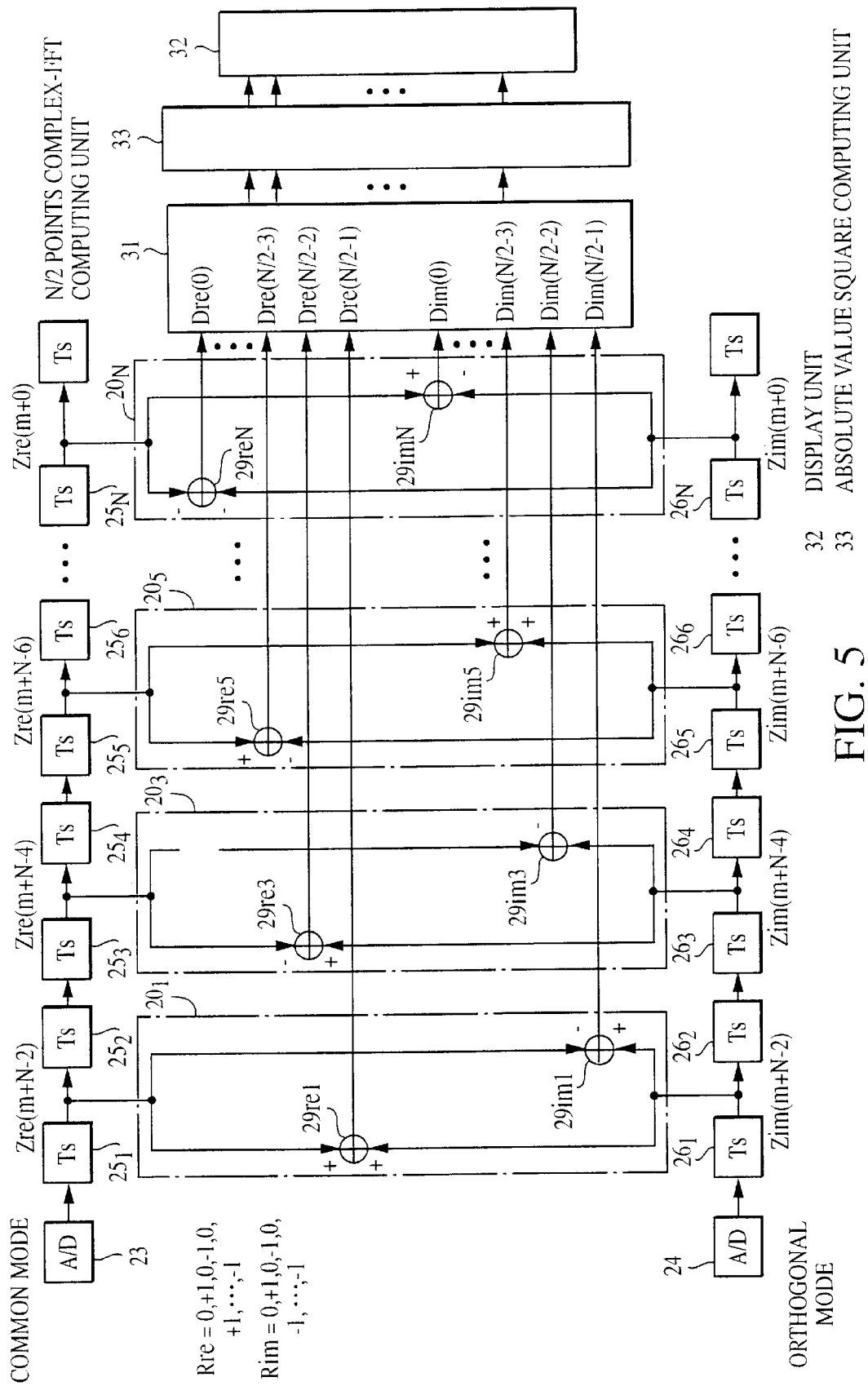
FIG. 5 is a diagram showing an example, which performs the method of FIG. 4B by a hardware.

In this case, complex-multipliers $20_1$–$20_N$ are constituted as shown in FIG. 5. With respect to FIG. 5, the same reference numbers are used to denote the same elements shown in FIG. 2. In this case, a sampling period Ts is one half of a chip period Tc of the diffusion code. Complex multipliers $20_2$–$20_N$ shown in FIG. 2, wherein N is an even number, are omitted, and complex multipliers $20_1$, $20_3$, $20_5$, - - - , wherein N is an odd number, are left. Furthermore, multipliers 27rei, 28rei, 27imi, 28imi are omitted, and odd numbered adders 29rei, 29imi are left. In accordance with common-mode Rre of the diffusion code signal, 0, +1, 0, –1, 0, +1, - - - , –1 and orthogonal-mode Rimi 0, +1, 0, +1, 0, –1, - - - , –1, outputs Zre(m+N–2(2i–1)) of the delay units $25_{2i-1}$ not code-changed if Rre, Rim is equal to +1, and those are code-changed if it is equal to –1. Furthermore, outputs Zim(m+N–2(2i–1)) of the delay units $26_{2i-1}$ are not code-changed if Rre, Rim is equal to +1, and those are code-changed if it is equal to –1. Then, the adder 29re(2i–1) supplies outputs Dre(2i–1) to N/2 points complex FFT unit, and the adder 29im(2i−1) supplies outputs Dim(2i−1) to N/2 points complex FFT unit.

With respect to an orthogonal transformer 16, a frequency mixer 18 multiplies the output A sin(ωt+θ) of a distributor 15 by a cosine wave signal cos(πn/2), i.e. 1, 0, −1, 0, 1, - - -, and a frequency mixer 19 multiplies the output A sin(ωt+θ) by a sinewave signal sin(πn/2), i.e. 0, 1, 0, −1, 0, - - -. Therefore, this system makes the calculation easier. The period of the series 0, 1, −1 is 1/f (2πf=ω).

The output of a band-pass filter 14 may be orthogonal-transformed after being converted to a digital series by an A/D converter.

Figure 6C:
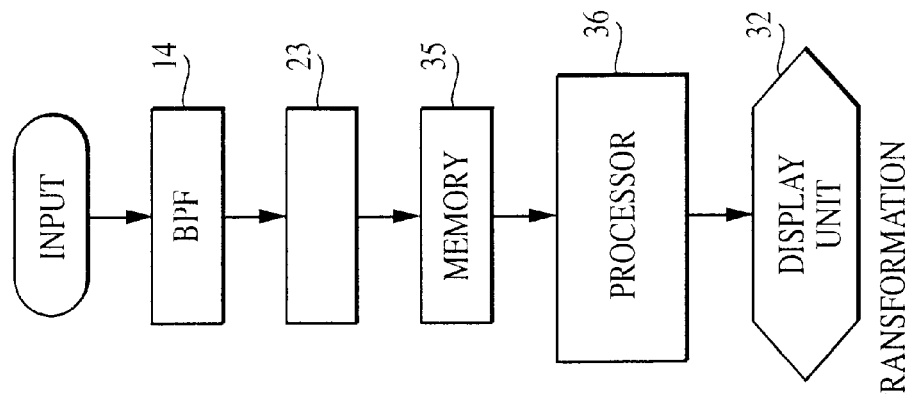
FIGS. 6A–6C are diagrams showing examples of the processing procedures according to the present invention.
Figure 6B:
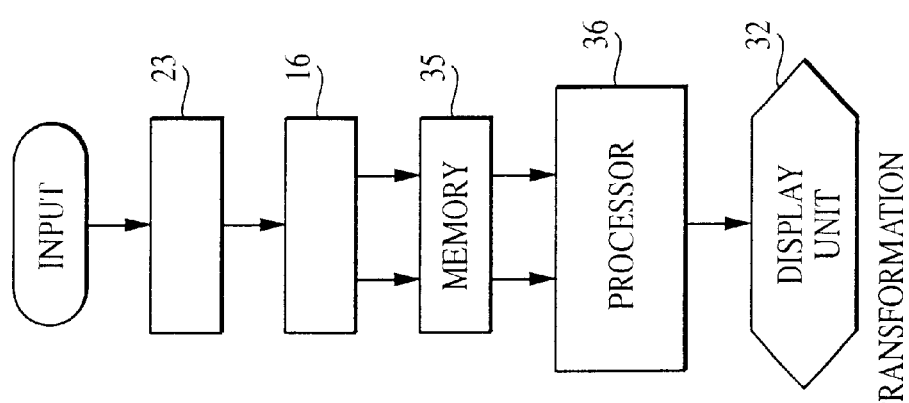
Figure 6A:
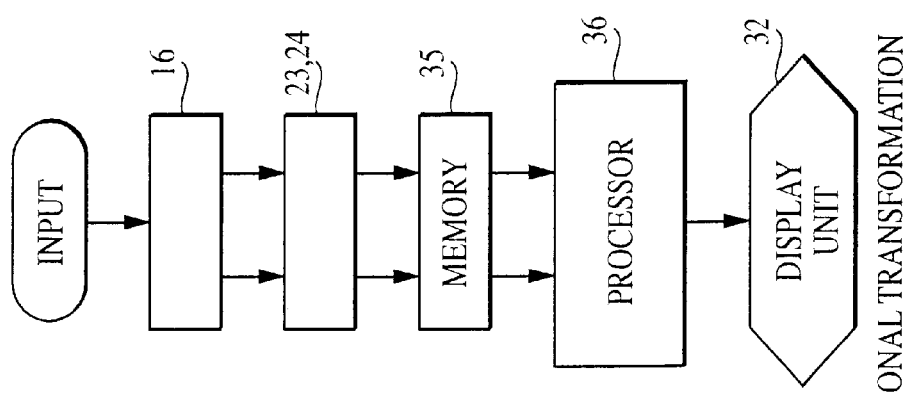

As mentioned above, the outputs of AD converters 23, 24 are stored in a memory 35, and then the data stored in the memory 35 is read out by a processor 36, as shown in FIG. 6A. The complex multiplication process and the FFT process explained with reference to FIGS. 1, 4, 5, may be performed by a software with the use of a CPU or a DSP. In this case, as shown in FIG. 6B, the orthogonal transformation may be digital-processed, and then stored in the memory 35. Furthermore, as shown in FIG. 6C, the output of the band-pass filter 14 may be directly transformed into the digital-data series, stored in the memory 35, and then, all the following steps may be performed by a software processing.

Figure 7:
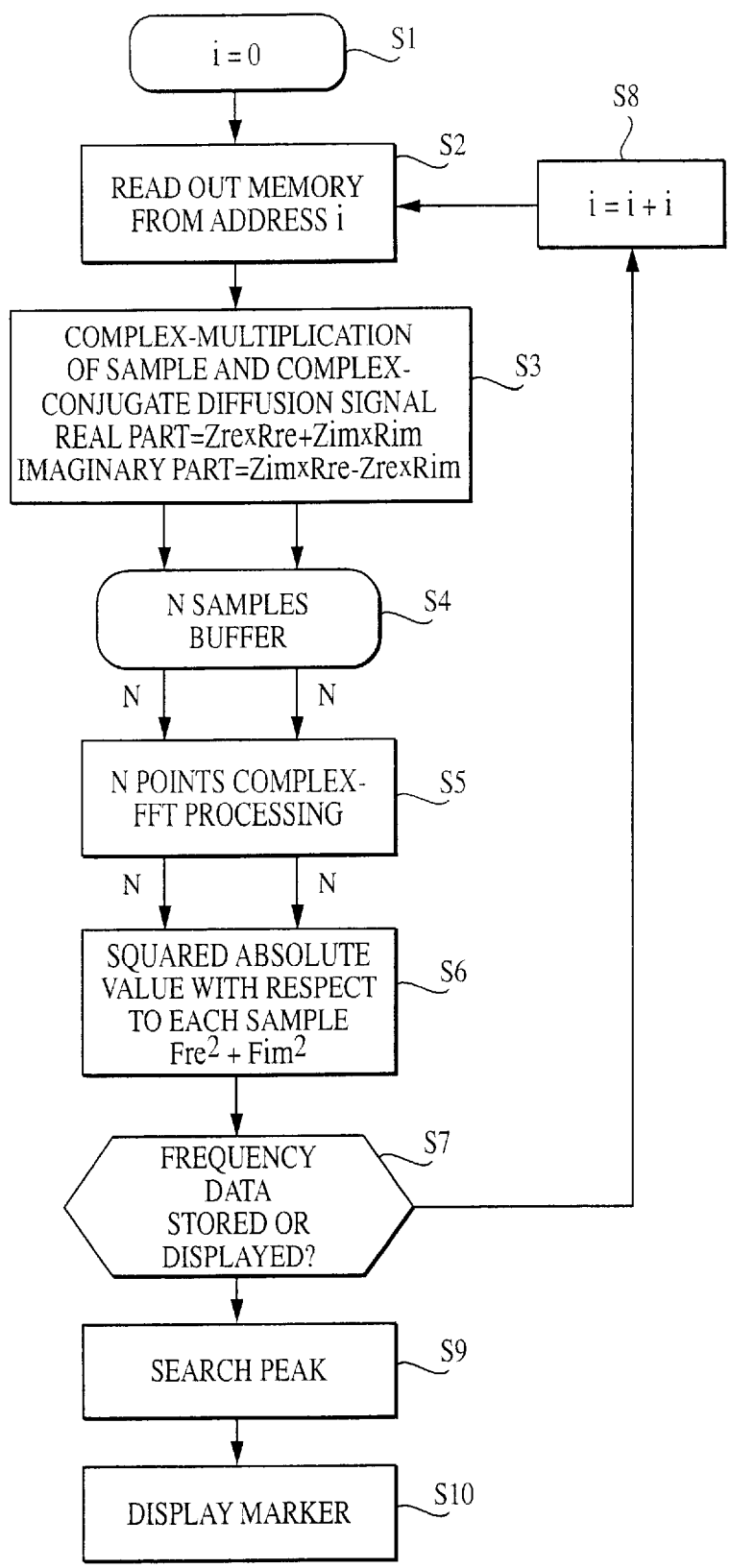
FIG. 7 is a diagram showing an example of the processing procedure performed by a processor 36 shown in FIG. 6 during the operation of the processor 36.

FIG. 7 is a flowchart showing the steps performed by the processor 36 shown in FIGS. 6A, B. Firstly, i is set to zero (S1), and sample data stored in the address i of the memory 35 is subsequently read out until i+N−1 (S2). Every time each data sample is read out, the complex-multiplication of the sample Z(m) and the complex-conjugate R* of the diffusion signal is performed (S3), and then, the result of the complex-multiplication is temporarily stored in a buffer (S4). If the result is obtained with respect to N sample datum, then N points complex-FFT processing is performed with respect to them (S5), and the square of absolute value of the coefficient, which is each frequency component of the result of the multiplication, is calculated (S6). Then, it is judged whether the data is displayed or stored (S7). Namely, it is judged whether i is updated by one period of the diffusion code. If data of one period is not obtained, it is judged that the data is stored, the calculation result of S6 is stored in a memory, i is increased by +1, and then, the process is returned to step S2 (S8).

In a case where a predetermined data corresponding to one period is obtained, and where it is judged at step S7 that the data is displayed, the maximum value of the stored calculation results of the step S6 is searched (S9). Then, the corresponding frequency and the timing phase are respectively displayed as a carrier wave frequency error and as a phase drift or displacement (S10). It may be possible to include the steps of displaying as shown in FIG. 3B or C at the step S9, searching the maximum peak by an operator checking the display, moving a maker to the peak, and then reading out the frequency error and the timing phase.

As explained above, according to the present invention, since the squared absolute values are calculated with respect to the results of the complex-FFT calculation, it is not necessary to sequentially change the local oscillation. Furthermore, within one period of the diffusion code, the carrier wave frequency and the timing phase can be obtained by a time-period processing, i.e. by sequentially changing the relative phase between the diffusion code signal and the orthogonal-transformed digital signal. Therefore, the processing time is shortened compared with the conventional processing wherein the time-synchronization processing is performed with respect to each frequency. Furthermore, the hardware scale is decreased, since the hardware for sequentially changing the frequency is not necessary.

Furthermore, as explained with reference to FIGS. 4 and 5, in a case where a sampling frequency is J times as common as a chip frequency (J is an integer.), the processing is performed at every $J_{th}$ samples, and therefore, the processing amount can be decreased. However, the processing period should be no more than the chip period. Therefore, the processing is performed at every chip period at a maximum level. Furthermore, the orthogonal-transformation is performed by using a local cosine wave comprising of a series of 1, 0, −1, 0, 1, - - -, and a local sinewave comprising of a series of 0, 1, 0, −1, 0, - - -. Therefore, the processing is simplified.

The present invention may be embodied in other preferred forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A spectrum diffusion signal analyzer comprising:
   means for orthogonal-transforming an inputted spectrum diffusion signal;
   means for calculating a product of the orthogonal-transformed signal and a complex-conjugate of a diffusion code signal;
   means for discrete-Fourier-transforming a data series of the calculated product; and
   means for calculating a squared absolute value of each Fourier-transformed coefficient.

2. A spectrum diffusion signal analyzer according to claim 1, further comprising:
   peak searching means for searching a displacement between a time when said each squared value has a maximum value within one period of the diffusion code signal and a reference time of said diffusion code signal, and for searching a carrier wave frequency error of the diffusion code signal.

3. A spectrum diffusion signal analyzer according to claim 2, further comprising:
   display means for displaying one of two orthogonal axes as a frequency axis and the other as a time axis,
   wherein the squared value is a function of the displacement from the reference time of said diffusion code signal and the carrier wave frequency error of diffusion code signal,
   and wherein the display means displays the displacement from the reference time of said diffusion code signal in relation to the time axis and the carrier wave frequency error of the diffusion code signal in relation to the frequency axis.

4. A spectrum diffusion signal analyzer according to claim 3, wherein the display means displays a level of the squared value by using another axis, which is perpendicular to the both of the orthogonal axes.

5. A spectrum diffusion signal analyzer according to claim 3, wherein the display means displays a level of the squared value by using a level of brightness.

6. A spectrum diffusion signal analyzer according to claim 3, wherein the display means displays a level of the squared value by using colors, each of which respectively corresponds to each level of the squared value.

7. A method of analyzing a spectrum diffusion signal comprising:

AD transforming an inputted spectrum diffusion signal into a digital data series;

orthogonal-transforming the digital data series, and temporally storing the orthogonal-transformed data series;

complex-multiplying each sample having the orthogonal-transformed data series and the complex conjugate of the diffusion code signal;

discrete-Fourier-transforming samples corresponding to a period of the diffusion code of the complex-multiplied sample;

calculating squared absolute values with respect to each frequency component of the discrete-Fourier-transformed samples;

repeating the multiplication, the Fourier-transformation, and the square calculation with sequentially shifting a relative phase between the orthogonal-transformed data series and the diffusion code signal within a chip period until a sum of the shifted relative phases arrives at one period of the diffusion code; and searching a timing drift from inputted signal to a calculated result of the square calculation in accordance with the calculated result of the square calculation, and of searching a carrier wave frequency error of the inputted signal.

8. A method of analyzing spectrum diffusion signal according to claim 7, wherein a sampling frequency used at the AD transformation is J times as common as a chip frequency of the diffusion code signal, wherein J is an integer, and wherein the multiplication is performed at every J samples.

9. A method of analyzing spectrum diffusion signal according to claim 8, wherein the diffusion code signal includes a binary data, and wherein at the multiplication, an adding process is performed with or without transforming a code of the orthogonal-transformed data in accordance with a value of the binary data of the diffusion code signal.

10. A method of analyzing spectrum diffusion signal according to claim 9, wherein the search includes searching a maximum peak of the squared value, and searching the corresponding frequency and time.

11. A method of analyzing spectrum diffusion signal according to claim 10, wherein the squared value is a function of the corresponding frequency and the time, and wherein one of two orthogonal axes is defined as a frequency axis and the other as a time axis, and wherein the corresponding frequency of the squared value is displayed in relation to the frequency axis and the time of the squared value is displayed in relation to the time axis, and wherein a level of the squared value is displayed by using a level of brightness.

12. A method of analyzing spectrum diffusion signal according to claim 10, wherein the squared value is a function of the corresponding frequency and the time, wherein one of two orthogonal axes is defined as a frequency axis and the other as a time axis, wherein the corresponding frequency of the squared value is displayed in relation to the frequency axis and the time of the squared value is displayed in relation to the time axis, wherein a level of the squared value is displayed by using colors, each of which respectively corresponds to each level of the squared value.

13. A spectrum diffusion signal analyzer comprising:

an orthogonal-transforming device that orthogonal-transforms an input spectrum diffusion signal;

a first calculation device that calculates a product of the orthogonal-transformed signal and a complex-conjugate of a diffusion code signal;

a discrete-Fourier-transformation device that discrete-Fourier-transforms a data series of the calculated product; and a second calculation device that calculates a squared absolute value of each Fourier-transformed coefficient.

14. A spectrum diffusion signal analyzer according to claim 13, further comprising:

a peak searching device that searches a displacement between a time when said each squared value has a maximum value within one period of the diffusion code signal and a reference time of said diffusion code signal and for searching a carrier wave frequency error of the diffusion code signal.

15. A spectrum diffusion signal analyzer according to claim 14, further comprising:

a display device that displays one of two orthogonal axes as a frequency axis and the other as a time axis wherein the squared value is a function of the displacement from the reference time of said diffusion code signal and the carrier wave frequency error of the diffusion code signal and wherein the display device displays the displacement from the reference time of said diffusion code signal in relation to the time axis and the carrier wave frequency error of the diffusion code signal in relation to the frequency axis.

16. A spectrum diffusion signal analyzer according to claim 15, wherein the display device displays a level of the squared value by using another axis, which is perpendicular to the both of the orthogonal axes.

17. The spectrum diffusion signal analyzer of claim 15, wherein said display device displays a level of said squared absolute value using a level of brightness.

18. The spectrum diffusion signal analyzer of claim 15, wherein said display device displays a level of said squared absolute value using colors, each color of respectively corresponds to each level of said squared absolute value.

* * * * *